(12) United States Patent
Mizusawa

(10) Patent No.: US 8,664,837 B2
(45) Date of Patent: Mar. 4, 2014

(54) PIEZOELECTRIC DEVICE AND METHOD FOR FABRICATING THE SAME

(71) Applicant: Nihon Dempa Kogyo Co., Ltd., Tokyo (JP)

(72) Inventor: Shuichi Mizusawa, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 13/769,834

(22) Filed: Feb. 19, 2013

(65) Prior Publication Data

US 2013/0214650 A1    Aug. 22, 2013

(30) Foreign Application Priority Data

Feb. 22, 2012   (JP) ................................. 2012-035973

(51) Int. Cl.
*H01L 41/053* (2006.01)
*H01L 41/047* (2006.01)
*H01L 41/09* (2006.01)

(52) U.S. Cl.
USPC ........... 310/348; 310/363; 310/364; 310/365; 310/366

(58) Field of Classification Search
USPC ......................................... 310/348, 363–366
See application file for complete search history.

(56) References Cited

U.S. PATENT DOCUMENTS

| 6,949,990 | B2 * | 9/2005 | Nishihara et al. | 333/189 |
| 7,132,737 | B2 * | 11/2006 | Miyazaki | 257/678 |
| 7,427,822 | B2 * | 9/2008 | Kusai | 310/344 |
| 2009/0108709 | A1 * | 4/2009 | Tsuchido | 310/364 |
| 2012/0176004 | A1 * | 7/2012 | Mizusawa et al. | 310/348 |
| 2012/0248940 | A1 * | 10/2012 | Ariji et al. | 310/348 |
| 2013/0207523 | A1 * | 8/2013 | Ichikawa | 310/348 |

FOREIGN PATENT DOCUMENTS

JP    2000-252375    9/2000

* cited by examiner

Primary Examiner — Thomas Dougherty
(74) Attorney, Agent, or Firm — Jianq Chyun IP Office

(57) ABSTRACT

A piezoelectric device includes a piezoelectric vibrating piece, a base plate, which has a connecting electrode on one principal surface and a mounting terminal on another principal surface, in a rectangular shape, and a lid plate. The another principal surface of the base plate includes a pair of sides that face one another. At least the pair of sides has a level difference portion depressed toward the one principal surface side and a castellation passing through from the another principal surface to the one principal surface. A wiring electrode extracted from the mounting terminal to the one principal surface of the base plate is at a part of the level difference portion and the castellation. The wiring electrode and the mounting terminal include a metal film formed by sputtering or vacuum evaporation and an electroless plating film formed on the metal film by electroless plating.

5 Claims, 14 Drawing Sheets

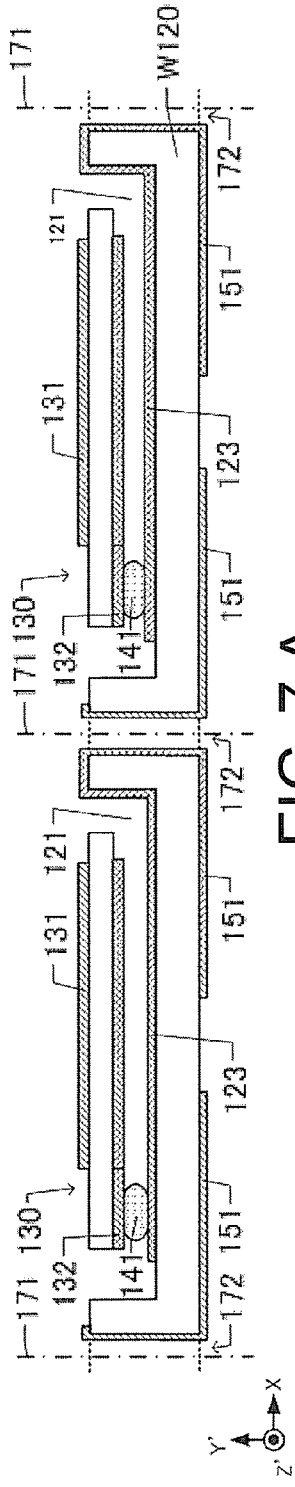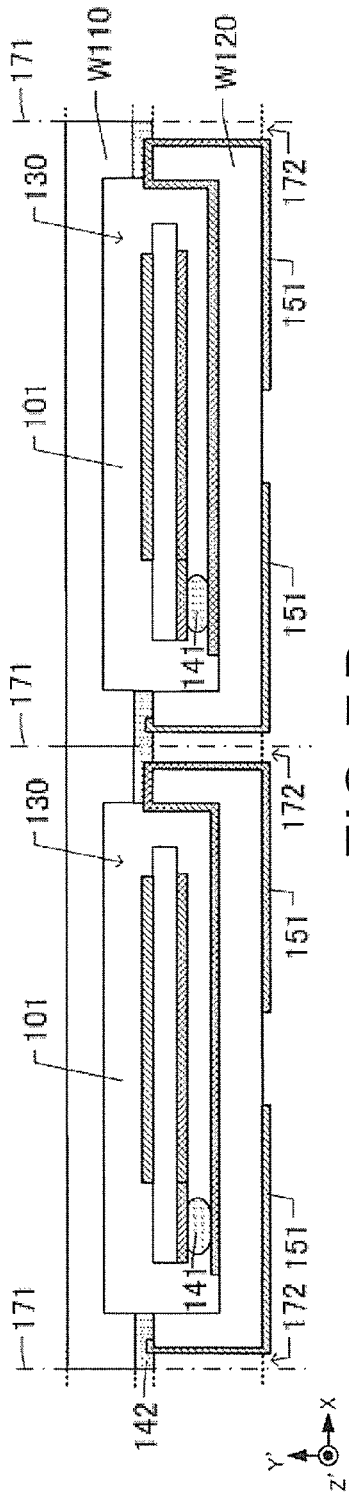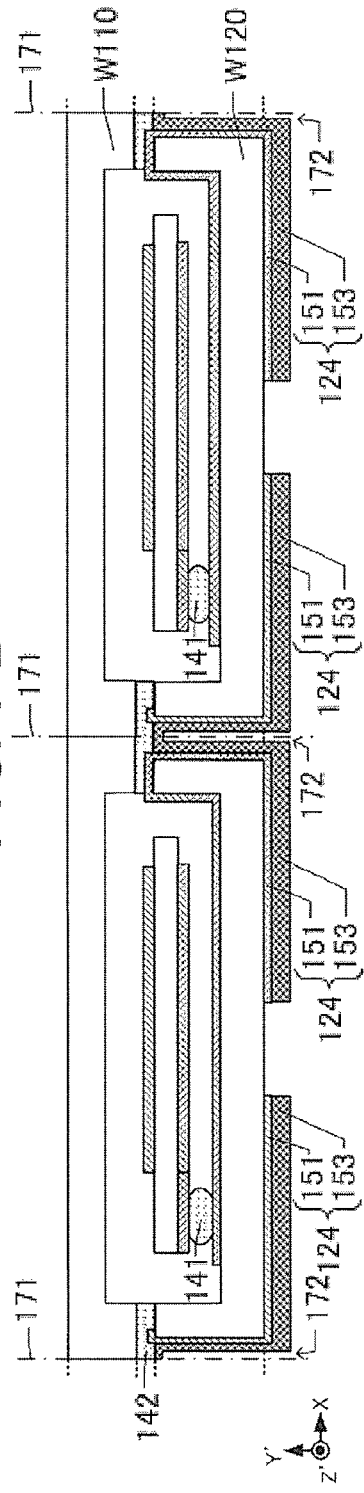

PIEZOELECTRIC DEVICE AND METHOD FOR FABRICATING THE SAME

CROSS REFERENCE TO RELATED APPLICATIONS

This application claims the priority benefit of Japan application serial no. 2012-035973, filed on Feb. 22, 2012. The entirety of the above-mentioned patent application is hereby incorporated by reference herein and made a part of this specification.

TECHNICAL FIELD

This disclosure relates to a piezoelectric device that includes an electrode formed by an electroless plating, and a method for fabricating the piezoelectric device.

DESCRIPTION OF THE RELATED ART

A surface mount type piezoelectric device that includes a piezoelectric vibrating piece, which vibrates at a predetermined vibration frequency, is known. A mounting terminal is formed on a surface of the piezoelectric device as an electrode. The piezoelectric device is mounted to a printed circuit board or similar member via this mounting terminal. Since the mounting terminal is formed on the surface of the piezoelectric device, the mounting terminal may be detached by heating of a solder or similar cause or may be damaged. Therefore, with the piezoelectric device, a thick film is formed on the mounting terminal by plating or similar method to ensure conduction. Additionally, the thick film formed by plating is also formed as a barrier layer that prevents the solder from absorbing a metal of the mounting terminal.

For example, Japanese Unexamined Patent Application Publication No. 2000-252375 discloses a mounting terminal formed by a conductive paste and a plating layer formed on a surface of the conductive paste.

However, since the plating layer is formed thick, the plating layer may apply stress to the piezoelectric device. The stress applied to the piezoelectric device warps the piezoelectric device, which causes a problem of detachment of the plating layer or the mounting terminal including the plating layer. Especially, this detachment occurs in a fabrication of the piezoelectric device employing a method where a plurality of piezoelectric devices is formed on a wafer, and then the wafer is diced to form individual piezoelectric devices. This is because that stress applied to the piezoelectric device changes at dicing of the wafer, thus increasing distortion of the piezoelectric device.

A need thus exists for a piezoelectric device which is not susceptible to the drawback mentioned above.

SUMMARY

A piezoelectric device according to a first aspect is a surface mount type piezoelectric device. The piezoelectric device includes a piezoelectric vibrating piece, a base plate in a rectangular shape, and a lid plate. The piezoelectric vibrating piece includes a vibrator with a pair of excitation electrodes and an extraction electrode extracted from the pair of excitation electrodes. The vibrator vibrates at a predetermined vibration frequency. The base plate has one principal surface and another principal surface. A pair of connecting electrodes is on the one principal surface and electrically connects to the extraction electrodes. A pair of mounting terminals is on the another principal surface. The piezoelectric device is to be mounted with the pair of mounting terminals. The lid plate seals the vibrator. The another principal surface of the base plate includes a pair of sides that face one another. At least the pair of sides has a level difference portion and a castellation. The level difference portion is depressed toward the one principal surface side. The castellation passes through from the another principal surface to the one principal surface. A wiring electrode is at a part of the level difference portion and the castellation. The wiring electrode is extracted from the mounting terminal to the one principal surface of the base plate. The wiring electrode and the mounting terminal include a metal film and an electroless plating film. The metal film is formed by sputtering or vacuum evaporation. The electroless plating film is formed on the metal film by electroless plating.

BRIEF DESCRIPTION OF THE DRAWINGS

The foregoing and additional features and characteristics of this disclosure will become more apparent from the following detailed description considered with the reference to the accompanying drawings, wherein:

FIG. 7A is a partial cross-sectional view of the base wafer W120 where a piezoelectric vibrating piece 130 is placed;

FIG. 7B is a partial cross-sectional view of the lid wafer W110, the piezoelectric vibrating piece 130, and the base wafer W120;

FIG. 7C is a partial cross-sectional view of the lid wafer W110, the piezoelectric vibrating piece 130 (as shown in FIGS. 7A and 7B), and the base wafer W120 where an electroless plating film 153 is formed;

DETAILED DESCRIPTION

The preferred embodiments of this disclosure will be described with reference to the attached drawings. It will be understood that the scope of the disclosure is not limited to the described embodiments, unless otherwise stated.

Constitution of a Piezoelectric Device 100 of a First Embodiment

Figure 1:
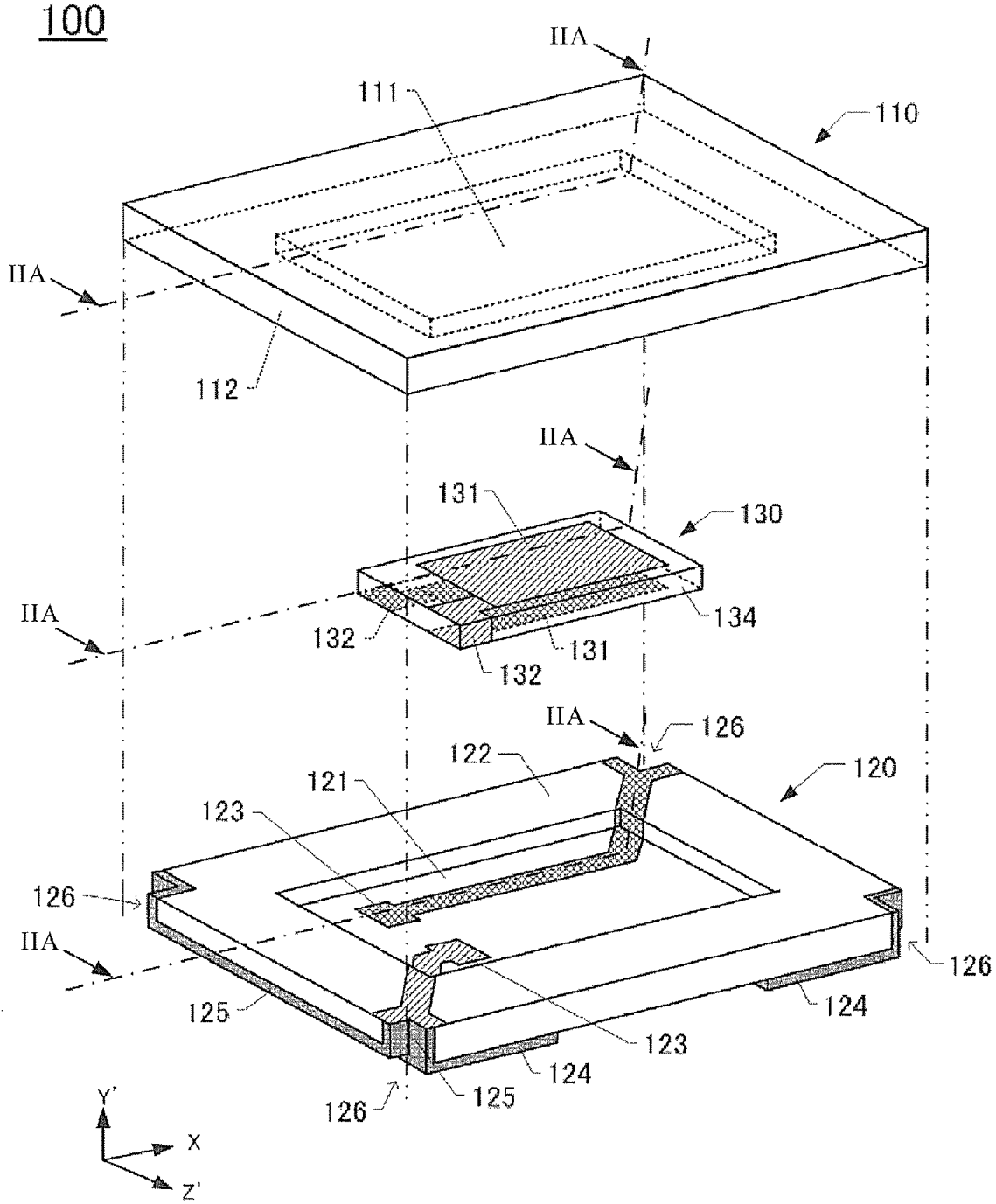
FIG. 1 is an exploded perspective view of a piezoelectric device 100.

FIG. 1 is an exploded perspective view of the piezoelectric device 100. The piezoelectric device 100 includes a lid plate 110, a base plate 120, and a piezoelectric vibrating piece 130. An AT-cut quartz-crystal vibrating piece, for example, is employed for the piezoelectric vibrating piece 130. The AT-cut quartz-crystal vibrating piece has a principal surface (in the Y-Z plane) that is tilted by 35° 15' about the Y-axis of crystallographic axes (XYZ) in the direction from the Z-axis to the Y-axis around the X-axis. In the following description, the new axes tilted with reference to the axis directions of the AT-cut quartz-crystal vibrating piece are denoted as the Y'-axis and the Z' axis. This disclosure defines the long side direction of the piezoelectric device 100 as the X-axis direction, the height direction of the piezoelectric device 100 as the Y'-axis direction, and the direction perpendicular to the X and Y'-axis directions as the Z'-axis direction.

The piezoelectric vibrating piece 130 includes a vibrator 134, an excitation electrode 131, and an extraction electrode 132. The vibrator 134 vibrates at a predetermined vibration frequency and has a rectangular shape. The excitation electrodes 131 are formed on surfaces at the +Y'-axis side and the −Y'-axis side of the vibrator 134. The extraction electrode 132 is extracted from each excitation electrode 131 to the −X-axis side. The extraction electrode 132 is extracted from the excitation electrode 131, which is formed on the surface at the +Y'-axis side of the vibrator 134. The extraction electrode 132 is extracted from the excitation electrode 131 to the −X-axis side, and is further extracted to the surface at the −Y'-axis side of the vibrator 134 via the side surface at the +Z'-axis side of the vibrator 134. The extraction electrode 132 is extracted from the excitation electrode 131, which is formed on the surface at the −Y'-axis side of the vibrator 134. The extraction electrode 132 is extracted from the excitation electrode 131 to the −X-axis side, and is formed up to the corner at the −X-axis side and the −Z'-axis side of the vibrator 134.

The base plate 120 employs a material such as a crystal and a glass as a base material. An electrode is formed on a surface of this base material. A bonding surface 122 is formed at the peripheral area of the surface at the +Y'-axis side of the base plate 120. The bonding surface 122 is to be bonded to the lid plate 110 via a sealing material 142 (see FIG. 2A). The base plate 120 includes a depressed portion 121 at the center of the surface at the +Y'-axis side. The depressed portion 121 is depressed from the bonding surface 122 in the −Y'-axis direction. The depressed portion 121 includes a pair of connecting electrodes 123. Each connecting electrode 123 electrically connects to an extraction electrode 132 of the piezoelectric vibrating piece 130 via a conductive adhesive 141 (see FIG. 2A). The base plate 120 includes a mounting terminal 124 on the surface at the −Y'-axis side. The mounting terminal 124 mounts the piezoelectric device 100 to a printed circuit board or similar member. The base plate 120 includes castellations 126 at four corners on the side surfaces. The castellation 126 is depressed inside of the base plate 120. The castellation 126 includes a wiring electrode 125 on its side surface. The mounting terminal 124 electrically connects to the connecting electrode 123 via the wiring electrode 125.

The lid plate 110 includes a depressed portion 111 on the surface at the −Y'-axis side. The depressed portion 111 is depressed in the +Y'-axis direction. A bonding surface 112 is formed surrounding the depressed portion 111. The bonding surface 112 is to be bonded to the bonding surface 122 of the base plate 120 via the sealing material 142 (see FIG. 2A).

Figure 2:
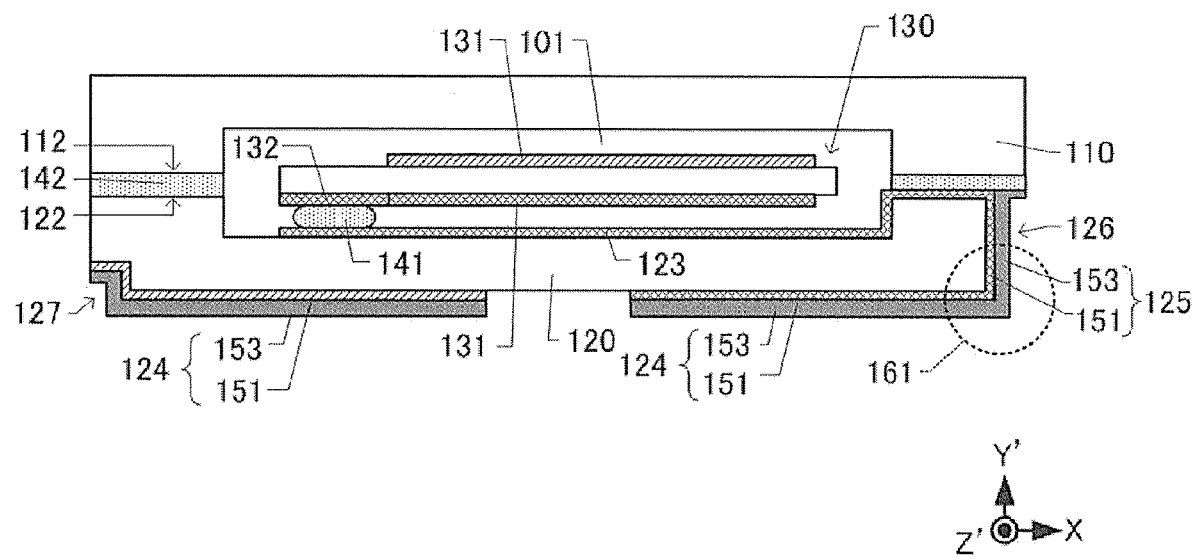
FIG. 2A is a cross-sectional view taken along the line IIA-IIA of FIG. 1.
FIG. 2B is an enlarged view of the portion enclosed by a dotted line 161 of FIG. 2A.
Figure 2:
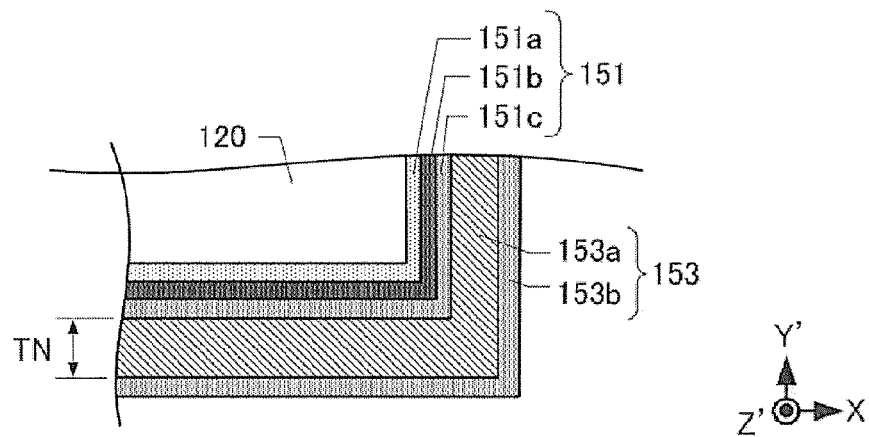

FIG. 2A is a cross-sectional view taken along the line IIA-IIA of FIG. 1. A sealed cavity 101 is formed in the piezoelectric device 100 by bonding the bonding surface 122 of the base plate 120 and the bonding surface 112 of the lid plate 110 together via the sealing material 142. The cavity 101 houses the piezoelectric vibrating piece 130. The extraction electrode 132 electrically connects to the connecting electrode 123 of the base plate 120 via the conductive adhesive 141. This electrically connects the excitation electrode 131 to the mounting terminal 124. Further, the mounting terminal 124 is formed by a first metal film 151 and an electroless plating film 153. The first metal film 151 is formed on the surface at the −Y'-axis side of the base material of the base plate 120. The electroless plating film 153 is formed on the surface of the first metal film 151.

FIG. 2B is an enlarged view of the portion enclosed by a dotted line 161 of FIG. 2A. FIG. 2B illustrates an enlarged cross-sectional view of the mounting terminal 124. The first metal film 151 is formed of three layers: a first layer 151a, a second layer 151b, and a third layer 151c. The first layer 151a is a layer made of a chrome (Cr) and is formed on a surface of the base material of the base plate 120. The chrome (Cr) is employed as a material of the first layer 151a for good adhesion to a material such as a crystal and a glass, which is the base material of the base plate 120. The third layer 151c, which is formed on a surface of the first metal film 151, is made of a gold (Au). The chrome (Cr) adheres well to a material such as a crystal and a glass, but does not stick to solder or similar material. Accordingly, the surface of the first metal film 151 is covered with a gold (Au), which sticks to a solder or similar material well. Further, in the first metal film 151, the second layer 151b is formed between the first layer 151a and the third layer 151c. When heat or the like is applied to the chrome (Cr), which constitutes the first layer 151a, during a fabrication process, the chrome diffuses to another layer. This reduces adhesion between the chrome (Cr) and the base plate 120. Further, when the chrome (Cr) diffuses to a surface of the first metal film 151, the chrome (Cr) oxidizes, making formation of the electroless plating film 153 or similar member difficult. To prevent this spread of the chrome (Cr), the second layer 151b is disposed. This prevents the chrome (Cr) from diffusing to the gold (Au) layer.

The second layer 151b is made of, for example, a nickel tungsten (Ni—W). The second layer 151b may be made of platinum (Pt). For example, when platinum (Pt) is employed, the first layer 151a is formed to have a thickness of 300 angstroms (Å) to 500 angstroms, the second layer 151b is formed to have a thickness of 1000 angstroms to 2000 angstroms, and the third layer 151c is formed to have a thickness of 1000 angstroms to 2000 angstroms. An electrode that includes the electroless plating film 153 is, when compared with an electrode that does not include the electroless plating film 153, likely to cause detachment due to distortion of the base plate 120 by stress generated by the electroless plating film 153. In the first metal film 151, formation of the second layer 151b prevents spread of the chrome (Cr), thus holding strong adhesion between the first metal film 151 and the base material of the base plate 120. This prevents detachment of the first metal film 151.

The electroless plating film 153 is formed of a first layer 153a and a second layer 153b. The first layer 153a is formed on a surface of the first metal film 151. The second layer 153b is formed on a surface of the first layer 153a. The first layer 153a is a nickel (Ni) layer and has the thickness TN of 1 μm to 3 μm. To ensure connection of the mounting terminal 124 and a solder or similar material, the second layer 153b made of a gold (Au) is formed on a surface of the first layer 153a.

Figure 3:
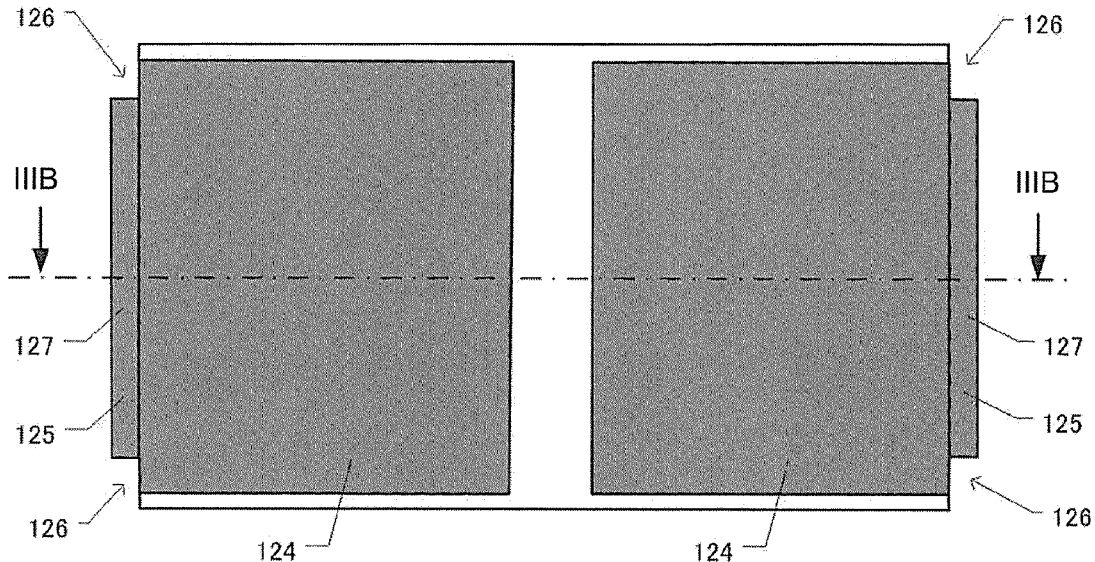
FIG. 3A is a plan view of the surface at the −Y'-axis side of a base plate 120.
FIG. 3B is a cross-sectional view taken along the line IIIB-IIIB of FIG. 3A.
Figure 3:
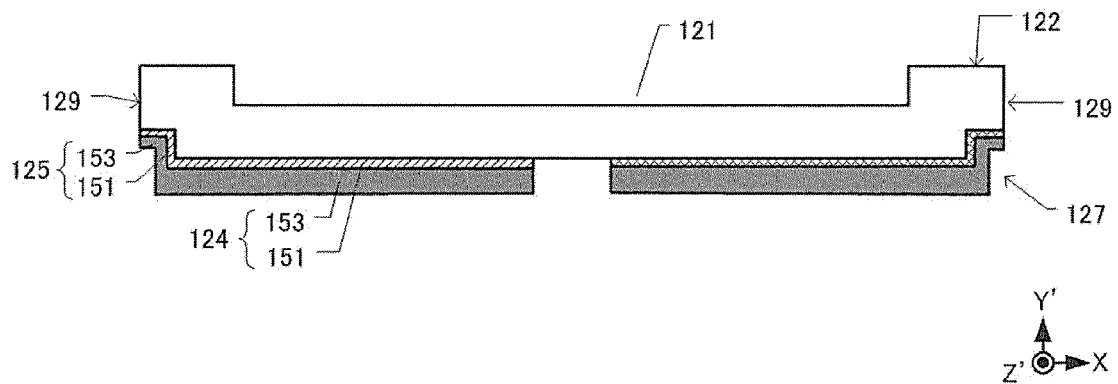

FIG. 3A is a plan view of the surface at the –Y'-axis side of the base plate 120. The base plate 120 includes castellations 126 at four corners on the side surfaces. The base plate 120 includes level difference portions 127 at a side of the –Y'-axis side and the +X-axis side, and at a side of the –Y'-axis side and the –X-axis side. The level difference portion 127 is depressed toward the +Y'-axis side. The level difference portion 127 includes the wiring electrode 125, which is the same as the castellation 126.

FIG. 3B is a cross-sectional view taken along the line IIIB-IIIB of FIG. 3A. The wiring electrode 125 is formed at the level difference portion 127 of the base plate 120. The wiring electrode 125 electrically connects to the mounting terminal 124. The first metal film 151 and the electroless plating film 153 are not formed on side surfaces 129 at the +X-axis side and the –X-axis side of the base plate 120. This portion, which contacts the level difference portion 127, is not the castellation 126.

Fabrication Method of the Piezoelectric Device 100

Figure 4:
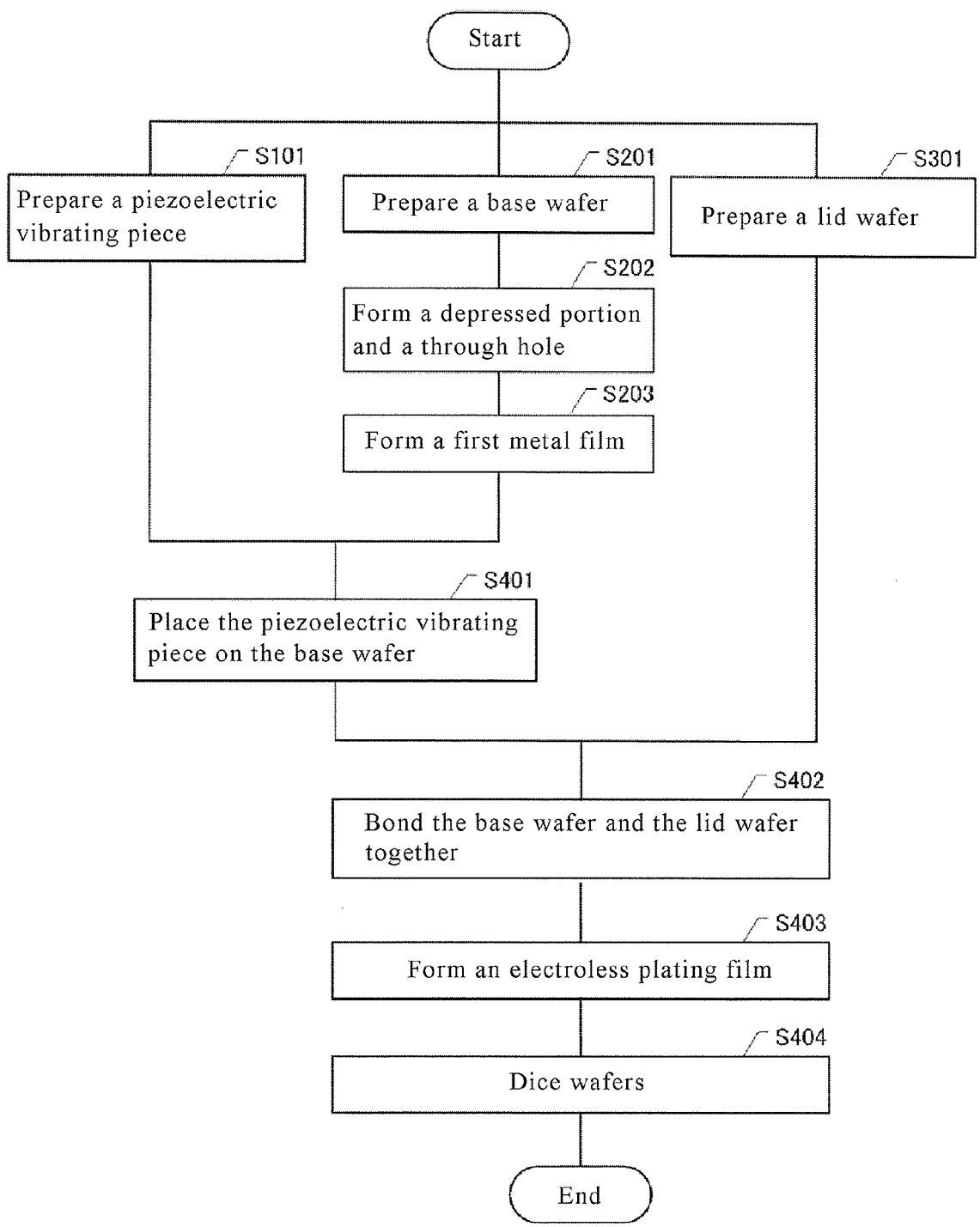
FIG. 4 is a flowchart illustrating a method for fabricating the piezoelectric device 100.

FIG. 4 is a flowchart illustrating a method for fabricating the piezoelectric device 100. A description will be given of the method for fabricating the piezoelectric device 100 following the flowchart of FIG. 4.

In step S101, a plurality of piezoelectric vibrating pieces 130 is prepared. Step S101 is a process for preparing a piezoelectric vibrating piece. In step S101, first, an outline of a plurality of piezoelectric vibrating pieces 130 is formed on a piezoelectric wafer, which is made of a piezoelectric material, by etching or similar method. Further, the excitation electrode 131 and the extraction electrode 132 are formed on each piezoelectric vibrating piece 130 by a method such as sputtering or vacuum evaporation. The plurality of piezoelectric vibrating pieces 130 is prepared by folding and removing the piezoelectric vibrating piece 130 from the piezoelectric wafer.

In step S201, the base wafer W120 is prepared. Step S201 is a process for preparing a base wafer. A plurality of base plates 120 is formed on the base wafer W120. The base wafer W120 prepared in step S201 has a planar shape, and a material such as a crystal or a glass is employed as the base material.

In step S202, a depressed portion 121, a through hole 172 (see FIG. 5A), and a depressed portion 173 (see FIG. 5B) are formed on the base wafer W120. The through hole 172 becomes the castellation 126 by dicing the base wafer W120. The depressed portion 173 becomes the level difference portion 127 by dicing the base wafer W120. Step S202 is a process for forming a depressed portion and a through hole.

In step S203, the first metal film 151 is formed on the base wafer W120. Step S203 is a process for forming a first metal film. The first metal film 151, which is formed on the base wafer W120, is formed of, for example, the first layer 151a, the second layer 151b, and the third layer 151c as illustrated in FIG. 2B. A chrome (Cr) constitutes the first layer 151a, a nickel tungsten (Ni—W) constitutes the second layer 151b, and a gold (Au) constitutes the third layer 151c. These layers are formed by sputtering or vacuum evaporation. In step S202, formation of the first metal film 151 forms the connecting electrode 123, a part of the wiring electrode 125, and a part of the mounting terminal 124 on each base plate 120.

Figure 5A:
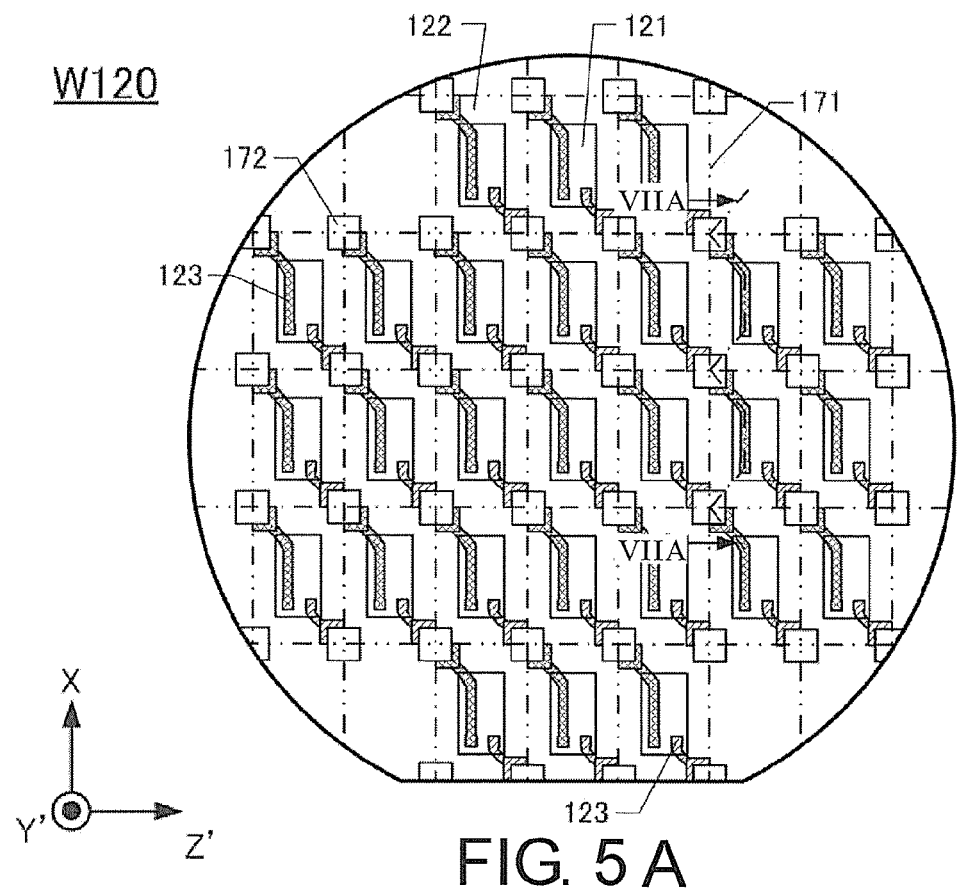
FIG. 5A is a plan view of the surface at the +Y'-axis side of a base wafer W120.

FIG. 5A is a plan view of the surface at the +Y'-axis side of the base wafer W120. The connecting electrode 123, which is formed by the first metal film 151 on the base wafer W120 illustrated in FIG. 5A, is illustrated. A plurality of base plates 120 is formed on the base wafer W120. Each base plate 120 is aligned in the X-axis direction and the Z'-axis direction. In FIG. 5A, a scribe line 171 is illustrated at a boundary between the base plates 120 adjacent one another. The scribe line 171 is a line that indicates a position at which the wafer is diced in step S404, which will be described below. The through hole 172 is formed at a position where the scribe line 171 extending in the X-axis direction, and the scribe line 171 extending in the Z'-axis direction, intersect. The through hole 172 passes through the base wafer W120 in the Y'-axis direction. After the wafer is diced in step S404, which will be described below, the through hole 172 becomes the castellations 126. The depressed portion 121 is formed on the surface at the +Y'-axis side of each base plate 120. The connecting electrode 123 is formed on the surface at the +Y'-axis side of each base plate 120.

Figure 5B:
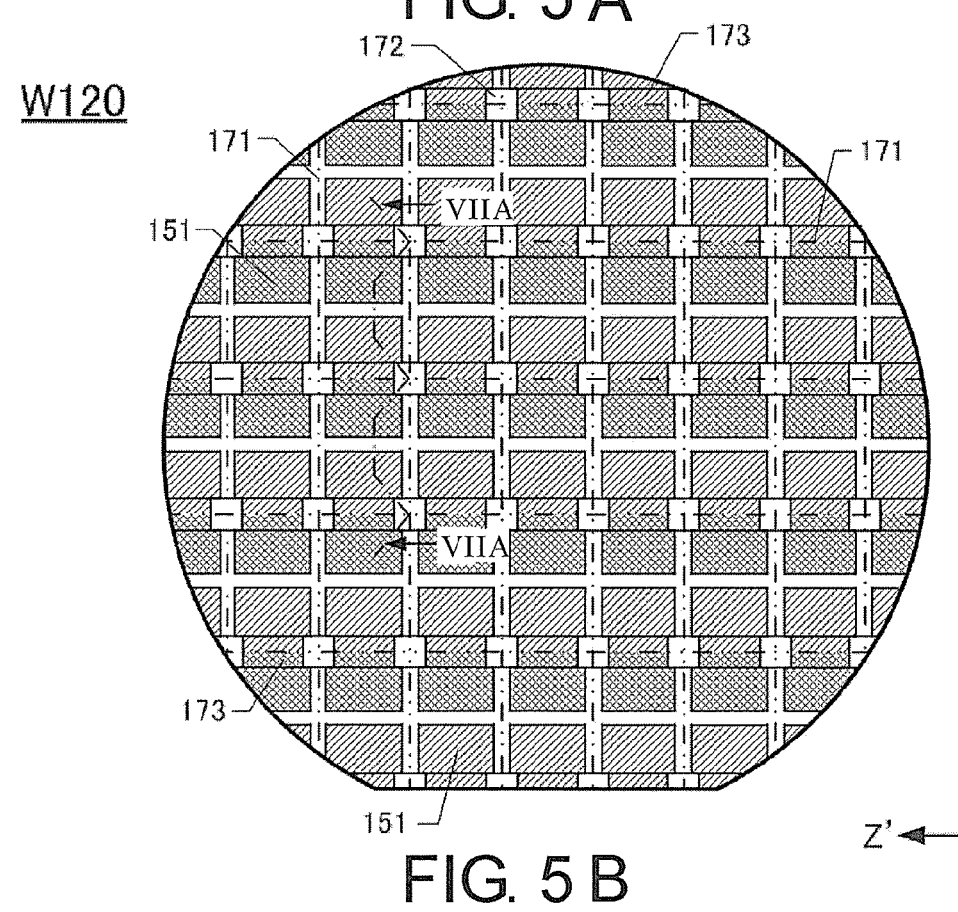
FIG. 5B is a plan view of the surface at the −Y'-axis side of the base wafer W120.

FIG. 5B is a plan view of the surface at the –Y'-axis side of the base wafer W120. The base wafer W120 illustrated in FIG. 5B includes a depressed portion 173. The depressed portion 173 includes the through hole 172 and the scribe line 171, which extends in the X-axis direction, and is depressed and extends in the Z'-axis direction. FIG. 5B also illustrates the first metal films 151 that become a part of the mounting terminal 124 and a part of the wiring electrode 125 by being formed on the depressed portion 173. The first metal films 151, which become a part of the wiring electrode 125, are formed on the through hole 172 and the depressed portion 173. The first metal film 151, which forms this wiring electrode 125, electrically connects to the connecting electrode 123.

Returning to FIG. 4, in step S301, a lid wafer W110 is prepared. Step S301 is a process for preparing the lid wafer W110. A plurality of lid plates 110 is formed on the lid wafer W110. The depressed portion 111 is formed on the surface at the –Y'-axis side of each lid plate 110.

Figure 6:
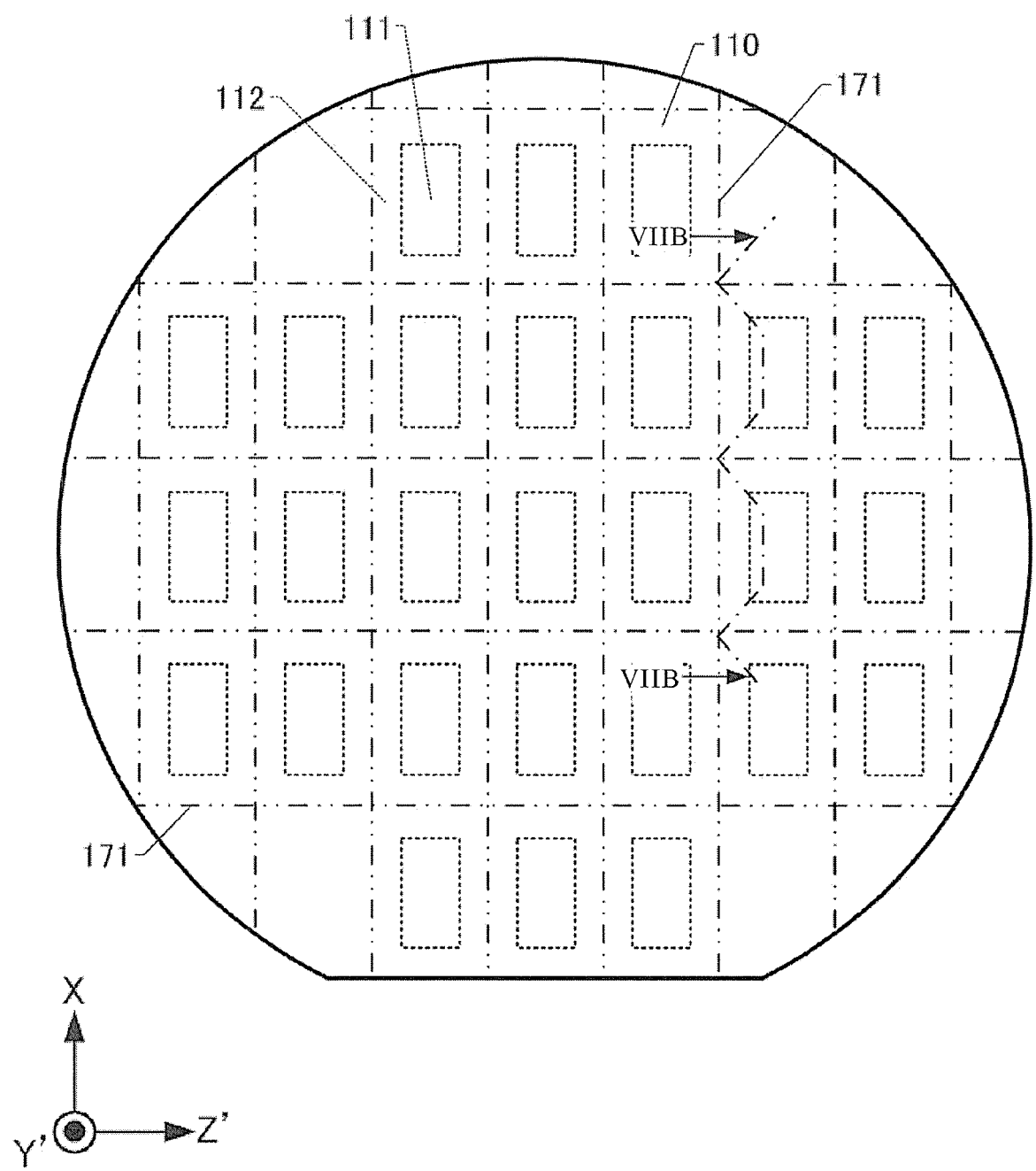
FIG. 6 is a plan view of the surface at the +Y'-axis side of a lid wafer W110.

FIG. 6 is a plan view of the surface at the +Y'-axis side of the lid wafer W110. A plurality of lid plates 110 is formed on the lid wafer W110. The depressed portion 111 and the bonding surface 112 are formed on the surface at the –Y'-axis side of each lid plate 110. In FIG. 6, a two-dot chain line is drawn between the lid plates 110 adjacent one another. This two-dot chain line is the scribe line 171.

In step S401, the piezoelectric vibrating piece 130 is placed on the base wafer W120. Step S401 is a placement process. The piezoelectric vibrating piece 130 is placed on each depressed portion 121 on the base wafer W120 with the conductive adhesive 141.

FIG. 7A is a partial cross-sectional view of the base wafer W120 where the piezoelectric vibrating piece 130 is placed. FIG. 7A illustrates a cross-sectional view including a cross section corresponding to the cross section taken along the line VIIA-VIIA of FIGS. 5A and 5B. The extraction electrode 132 and the connecting electrode 123 are electrically connected together via the conductive adhesive 141. Thus, the piezoelectric vibrating piece 130 is placed on the depressed portion 121 of the base wafer W120. This electrically connects the excitation electrode 131 and the first metal film 151, which is formed on the surface at the −Y'-axis side of the base wafer W120.

In step S402, the base wafer W120 and the lid wafer W110 are bonded together. Step S402 is a bonding process. The base wafer W120 and the lid wafer W110 are bonded as follows. The sealing material 142 (see FIG. 2A) is applied to the bonding surface 122 of the base wafer W120 or the bonding surface 112 of the lid wafer W110. Then, the bonding surface 122 of the base wafer W120 and the bonding surface 112 of the lid wafer W110 are bonded such that they face each other while sandwiching the sealing material 142.

FIG. 7B is a partial cross-sectional view of the lid wafer W110, the piezoelectric vibrating piece 130, and the base wafer W120. FIG. 7B illustrates a cross-sectional view including a cross section corresponding to the cross section taken along the line VIIA-VIIA of FIGS. 5A and 5B and the line VIIB-VIIB of FIG. 6. The lid wafer W110 and the base wafer W120 are bonded together via the sealing material 142. Thus, the sealed cavity 101 is formed. The piezoelectric vibrating piece 130 is placed on the cavity 101.

In step S403, the electroless plating film 153 is formed. Step S403 is a process of electroless plating. In step S403, the electroless plating films 153 are formed on the surfaces of the first metal films 151, which are formed on the surface of the base wafer W120 at the −Y'-axis side, the depressed portion 173, and the through hole 172.

FIG. 7C is a partial cross-sectional view of the lid wafer W110, the piezoelectric vibrating piece 130, and the base wafer W120 where the electroless plating film 153 is formed. FIG. 7C illustrates a cross-sectional view of the cross section similar to FIG. 7B. First, the electroless plating film 153 is formed as illustrated in FIG. 2B. A thick film of a nickel (Ni) is formed on a surface of the first metal film 151 by electroless plating so as to form the first layer 153a. Further, an electroless plating is performed with a gold (Au) on the surface of the first layer 153a, thus the second layer 153b is formed.

Figure 8:
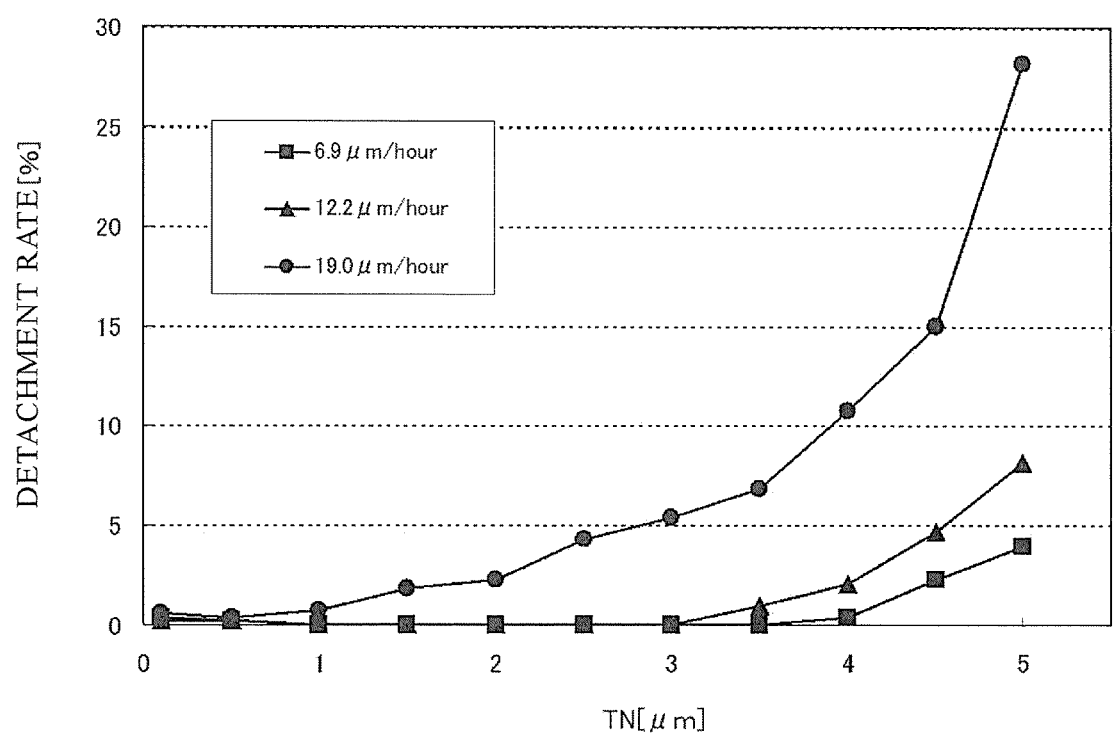
FIG. 8 is a graph illustrating a relationship between a thickness TN of a nickel (Ni) layer of the electroless plating film 153 and a detachment rate of the electroless plating film 153.

FIG. 8 is a graph illustrating a relationship between the thickness TN of a nickel (Ni) layer of the electroless plating film 153 and a detachment rate of the electroless plating film 153. FIG. 8 illustrates results in the case where the nickel (Ni) layer of the electroless plating film 153 is formed at three speeds: 6.9 μm/hour, 12.2 μm/hour, and 19.0 μm/hour. In the graph, the black square indicates a formation speed of 6.9 μm/hour, the black triangle indicates a formation speed of 12.2 μm/hour, and the black circle indicates a formation speed of 19.0 μm/hour. The formation speed can be adjusted, for example, by a temperature condition. The following is assumed. When the formation speed is 6.9 μm/hour, the temperature is 45° C. to 55° C. When the formation speed is 12.2 μm/hour, the temperature is 60° C. to 70° C. When the formation speed is 19.0 μm/hour, the temperature is 70° C. to 80° C. The detachment rate is obtained by performing the following methods. A scratch test confirms whether the metal film detaches or not by scratching a surface of the metal film with a metal needle or a diamond stylus. A tape peeling test confirms whether the metal film detaches or not by peeling a tape pasted on the metal film. The detachment rate in FIG. 8 indicates a rate of the number of individuals from which the metal film is detached relative to the number of individuals that are target for the tests.

In the case where the formation speeds are 6.9 μm/hour and 12.2 μm/hour, the detachment rate exists but is small when the thickness TN of the nickel layer is 0.1 μm to 1 μm. This is possibly because when the thickness TN of the nickel layer is thin, the nickel layer is not completely secured to the surface of the metal film. In the case where the formation speed is 6.9 μm/hour, the detachment rate is 0% at the thickness TN of between 1 μm to 3.5 μm and increases when the thickness TN becomes equal to or more than 3.5 μm. In the case where the formation speed is 12.2 μm/hour, the detachment rate is 0% at the thickness TN of between 1 μm to 3 μm and increases when the thickness TN becomes equal to or more than 3 μm. In the case where the formation speed is 19.0 μm/hour, the detachment rate exists but is small when the thickness TN of the nickel layer is 0.1 μm to 1 μm. In the case where the thickness TN is 1 μm, the detachment rate becomes the lowest value. In the case where the thickness TN is equal to or more than 1 μm, the detachment rate increases as the thickness TN becomes thick.

It can be seen from the graph of FIG. 8 when the formation speed of the nickel layer is from 6.9 μm/hour to 12.2 μm/hour and the thickness TN of the nickel layer is 1.0 μm to 3.0 μm, the detachment rate becomes 0%. This is a preferred condition. Further, it is considered when the formation speed of the nickel layer is from 5 μm/hour to 15 μm/hour, at least the detachment rate becomes 0% or a value close to 0%. This is a preferred condition.

Returning to FIG. 4, in step S404, the lid wafer W110 and the base wafer W120 are diced. The lid wafer W110 and the base wafer W120 are diced at the scribe line 171 by a method such as dicing. Step S404 is a dicing process.

Stress is generated in a wafer, on which an electroless plating film is formed, corresponding to the length of the electroless plating film. For example, as the base wafer W120 illustrated in FIG. 5B, the first metal film 151 may be formed long sequentially in the X-axis direction. Further, in the case where the electroless plating film 153 is formed on a surface of this first metal film 151, the electroless plating film 153 is formed long in the X-axis direction. Therefore, stress corresponding to the length of the electroless plating film 153 in the X-axis direction is applied in the X-axis direction. This warps the surface at the −Y'-axis side of the base wafer W120 to hollow. This stress changes by dicing the wafer in step S404, causing distortion of the piezoelectric device. A mounting terminal formed in the piezoelectric device may be detached by this distortion. With the piezoelectric device 100, the depressed portion 173, which extends in the Z'-axis direction, is formed to obstruct the electroless plating film 153 formed long in the X-axis direction. Accordingly, stress generated in the base wafer W120 in the X-axis direction is dispersed and becomes small. Even if the wafer is diced in step S404, distortion generated in the piezoelectric device 100 can be reduced. Therefore, with the piezoelectric device 100, after the wafer is diced, detachment of the mounting terminal, which is caused by stress of the electroless plating film 153, can be prevented.

With the piezoelectric device 100, the following can reduce the detachment rate of the electroless plating film 153. The formation speed of the nickel layer of the electroless plating film 153 is set to 5 μm/hour to 15 μm/hour, and the thickness TN of the nickel layer is set to 1 μm to 3 μm.

Modification of the Base Plate 120

Figure 9:
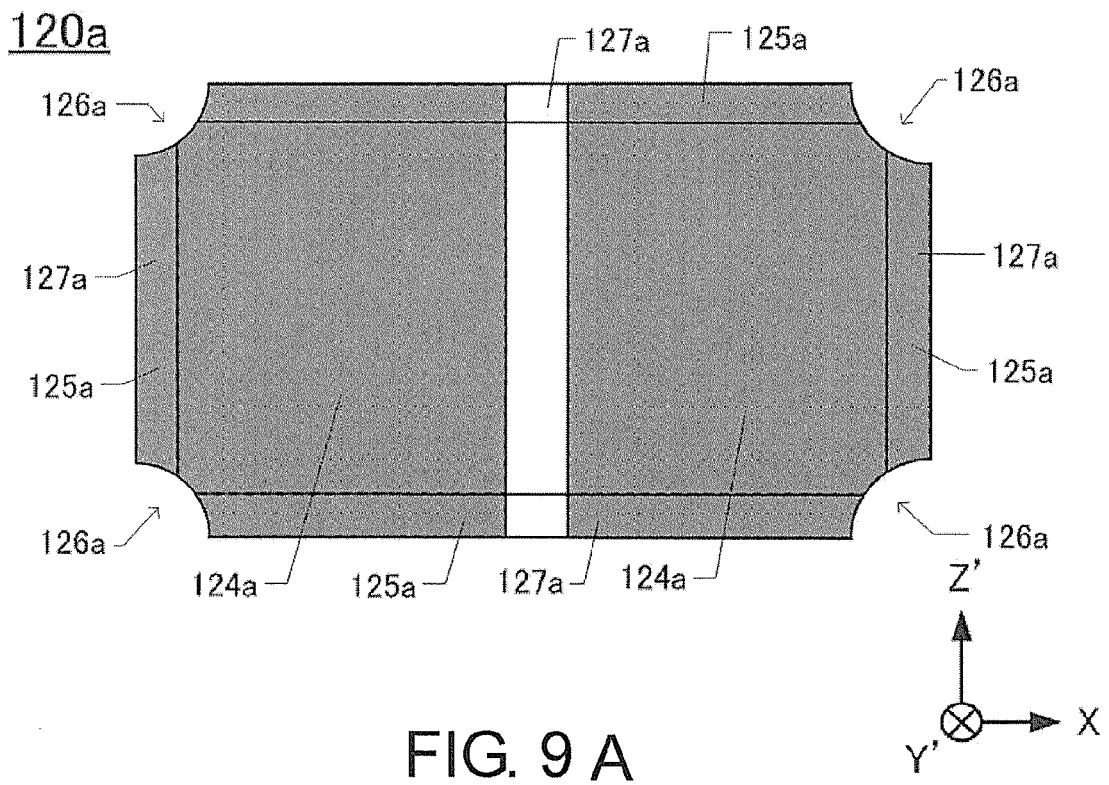
FIG. 9A is a plan view of a base plate 120a at the −Y'-axis side.
FIG. 9B is a plan view of a surface at the −Y'-axis side of a base wafer W120a where a plurality of base plates 120a is formed.
Figure 9:
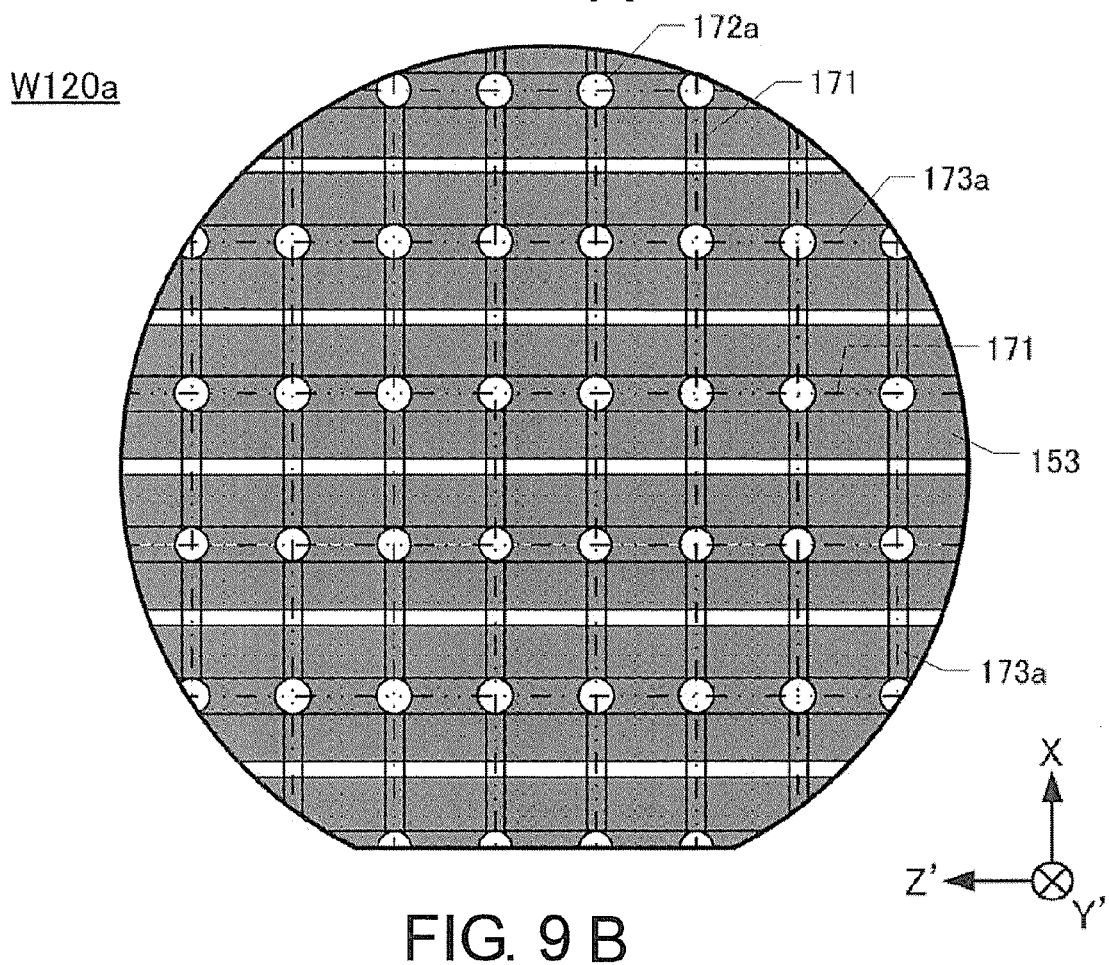

FIG. 9A is a plan view of a base plate 120a at the −Y'-axis side. The base plate 120a is a modification of the base plate 120. The base plate 120a includes a castellation 126a at a corner of a side surface. The base plate 120a also includes a level difference portion 127a formed surrounding an outer periphery of the surface at the −Y'-axis side. As illustrated in FIG. 3B, the level difference portion 127a is formed to be depressed toward the +Y'-axis side. The base plate 120a includes a mounting terminal 124a on the surface at the −Y'-axis side. Wiring electrodes 125a are formed at the side surface of the castellation 126a and the level difference portion 127a.

FIG. 9B is a plan view of a surface at the −Y'-axis side of a base wafer W120a where a plurality of base plates 120a is formed. FIG. 9B illustrates the base wafer W120a after step S403 in FIG. 4. The base wafer W120a includes a through hole 172a at the intersection point of the scribe line 171 that extends in the X-axis direction, and the scribe line 171 that extends in the Z'-axis direction. A depressed portion 173a, which is depressed in the +Y'-axis side, is formed along the scribe line 171 that extends in the X-axis direction, and the scribe line 171 that extends in the Z'-axis direction. In short, the depressed portion 173a is formed surrounding a peripheral area of each base plate 120a. Additionally, the electroless plating film 153, which is formed on the surface at the −Y'-axis side of the base wafer W120a, is formed to sequentially extend in the Z'-axis direction.

The electroless plating film 153, which is formed on the base wafer W120a, is formed with a width in the X-axis direction, and formed long to extend in the Z'-axis direction, similarity to the base wafer W120. Accordingly, strong stress is likely to be applied to the base wafer W120a in the Z'-axis direction as well as the X-axis direction. Meanwhile, with the base wafer W120a, the depressed portion 173a is formed along the scribe line 171. This disperses and reduces the stress generated by the electroless plating film 153. Hence, strong stress is not applied to the base wafer W120a, and large distortion is not generated in the piezoelectric device after dicing of the base wafer W120a. This prevents detachment of the mounting terminal caused by stress of the electroless plating film 153. Since the scribe line 171 overlaps the depressed portion 173a, a dicing portion of the wafer becomes thin, thus making wafer dicing easy.

Second Embodiment

A piezoelectric vibrating piece that includes a framing portion surrounding a peripheral area of a vibrator may be employed as a piezoelectric vibrating piece. A description will be given of a piezoelectric device 200 where a piezoelectric vibrating piece with a framing portion is employed. The embodiment will now be described wherein like reference numerals designate corresponding or identical elements throughout the embodiments.

Constitution of the Piezoelectric Device 200

Figure 10:
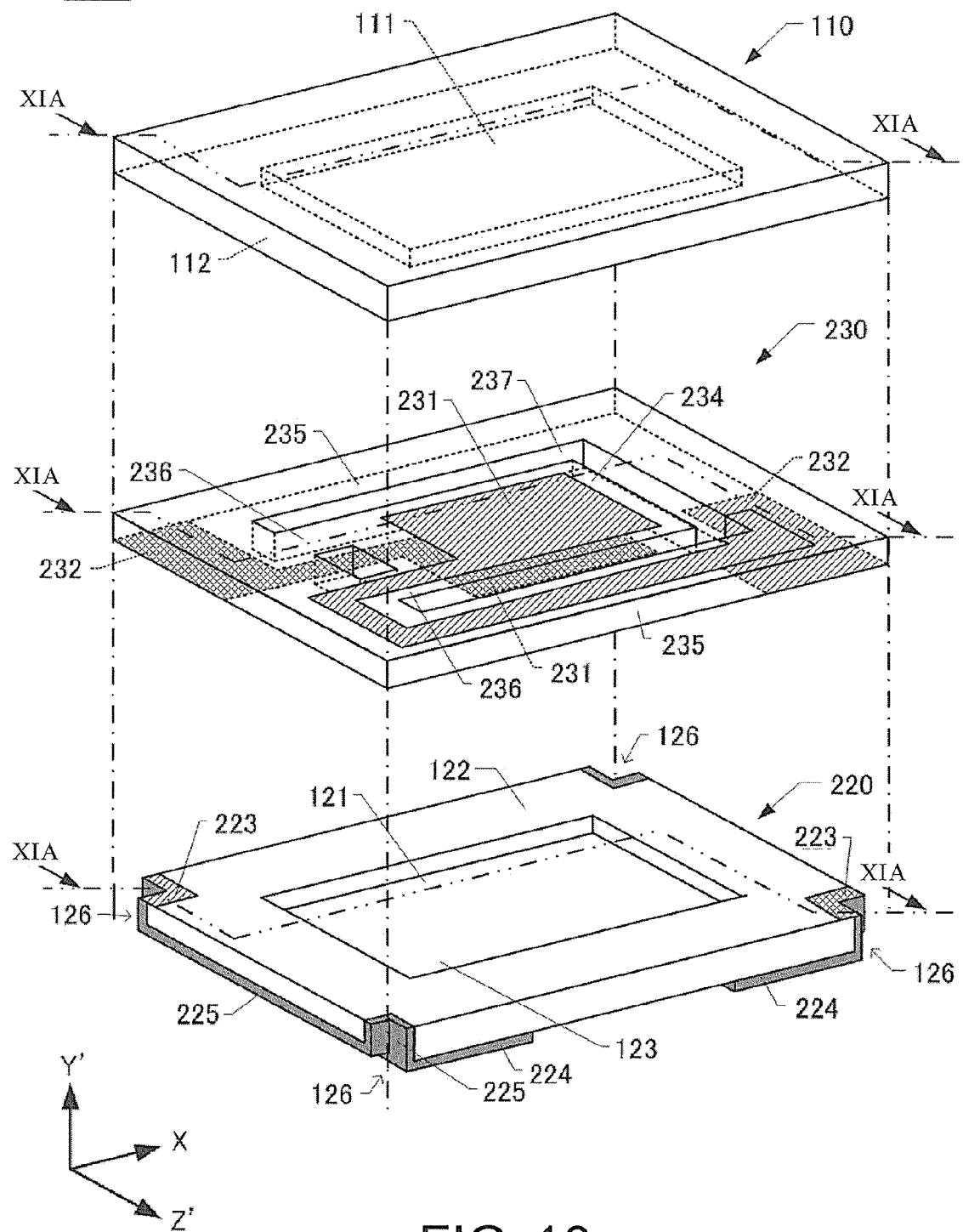
FIG. 10 is an exploded perspective view of a piezoelectric device 200.

FIG. 10 is an exploded perspective view of the piezoelectric device 200. The piezoelectric device 200 includes a lid plate 110, a base plate 220, and a piezoelectric vibrating piece 230. With the piezoelectric device 200, similarly to the first Embodiment, an AT-cut quartz-crystal vibrating piece is employed for the piezoelectric vibrating piece 230.

The piezoelectric vibrating piece 230 includes a vibrator 234, a framing portion 235, and a connecting portion 236. The vibrator 234 vibrates at a predetermined frequency and has a rectangular shape. The framing portion 235 is formed to surround a peripheral area of the vibrator 234. The connecting portion 236 connects the vibrator 234 and the framing portion 235. Between the vibrator 234 and the framing portion 235, a through groove 237 that passes through the piezoelectric vibrating piece 230 in the Y'-axis direction is formed. The vibrator 234 and the framing portion 235 do not directly contact one another. The vibrator 234 and the framing portion 235 are connected together via the connecting portion 236 connected at the −X-axis side and the +Z'-axis side, and at the −X-axis side and the −Z'-axis side of the vibrator 234. Further, excitation electrodes 231 are formed on surfaces of the +Y'-axis side and the −Y'-axis side of the vibrator 234. An extraction electrode 232 is extracted from each excitation electrode 231 to the framing portion 235. The extraction electrode 232 is extracted from the excitation electrode 231, which is formed on the surface at the +Y'-axis side of the vibrator 234. The extraction electrode 232 is extracted to the −X-axis side of the framing portion 235 via the connecting portion 236 at the +Z'-axis side, and is further extracted up to the corner at the +X-axis side and the +Z'-axis side on the surface at the −Y'-axis side of the framing portion 235. The extraction electrode 232 is extracted from the excitation electrode 231, which is formed on the surface at the −Y'-axis side of the vibrator 234. The extraction electrode 232 is extracted to the −X-axis side of the framing portion 235 via the connecting portion 236 at the −Z'-axis side, and is further extracted up to the corner at the −X-axis side and the −Z'-axis side on the surface at the −Y'-axis side of the framing portion 235.

A bonding surface 122 is formed at the peripheral area of the surface at the +Y'-axis side of the base plate 220. The bonding surface 122 is to be bonded to the lid plate 110 via a sealing material 142 (see FIG. 11A). The base plate 220 includes a depressed portion 121 at the center of the surface at the +Y'-axis side. The depressed portion 121 is depressed from the bonding surface 122 in the −Y'-axis direction. A mounting terminal 224 is formed on the surface at the −Y'-axis side of the base plate 220. A castellation 126 is formed at a corner of a side surface of the base plate 220. A connecting electrode 223 is formed at a peripheral area of the castellation 126 on the bonding surface 122 of the base plate 220. The connecting electrode 223 electrically connects to the mounting terminal 224 via a wiring electrode 225, which is formed at the castellation 126.

Figure 11:
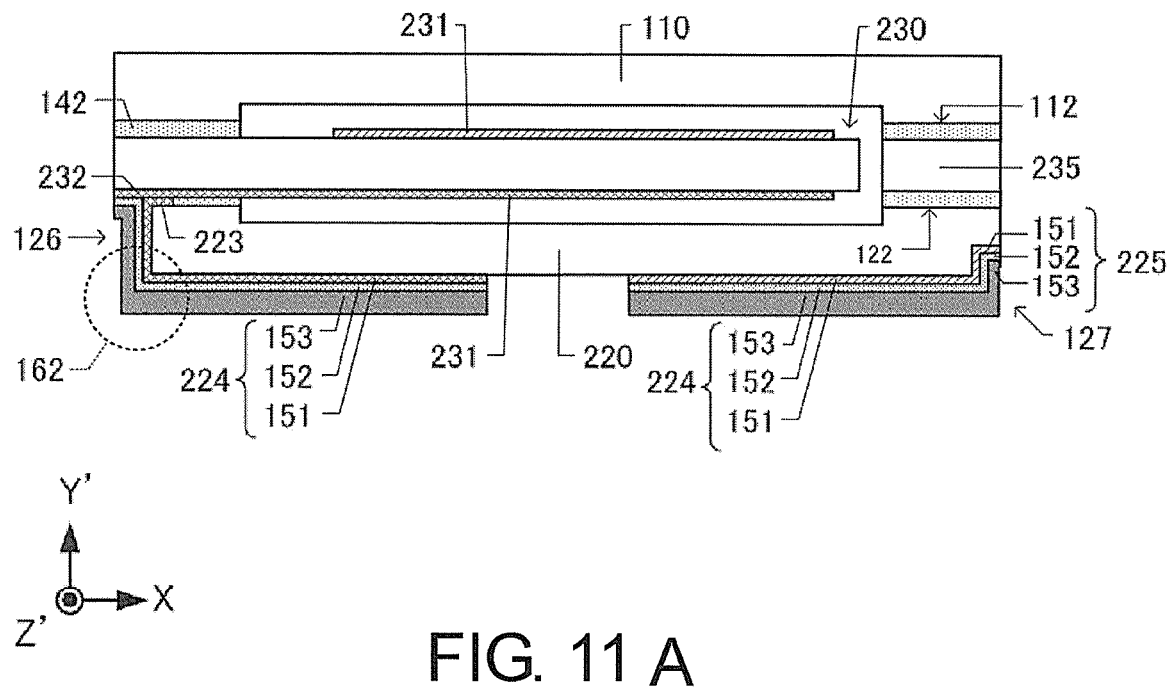
FIG. 11A is a cross-sectional view taken along the line XIA-XIA of FIG. 10.
FIG. 11B is an enlarged view of the portion enclosed by a dotted line 162 of FIG. 11A.
Figure 11:
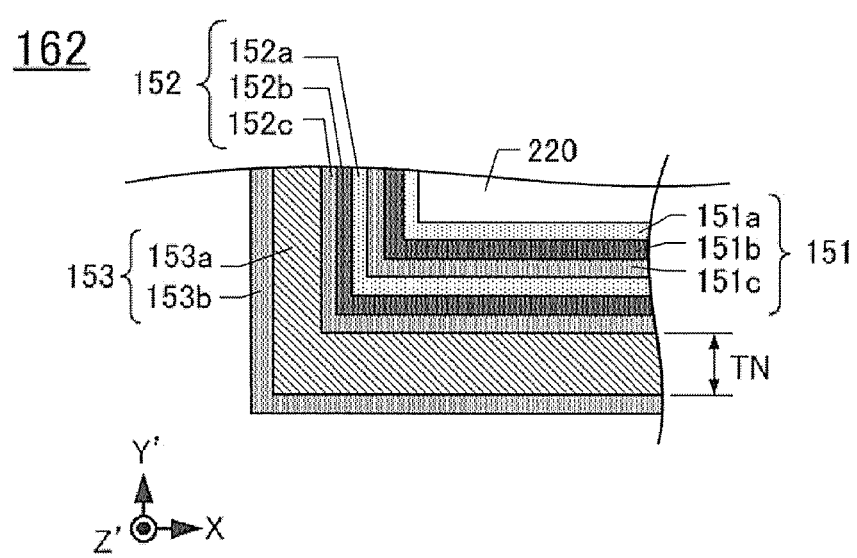

FIG. 11A is a cross-sectional view taken along the line XIA-XIA of FIG. 10. The piezoelectric device 200 is formed by bonding the bonding surface 112 of the lid plate 110 and the surface at the +Y'-axis side of the framing portion 235 together via the sealing material 142. The bonding surface 122 of the base plate 220 and the surface at the −Y'-axis side of the framing portion 235 are bonded together via the sealing material 142. The extraction electrode 232 and the connecting electrode 223 are electrically bonded together at the bonding of the piezoelectric vibrating piece 230 and the base plate 220. This electrically connects the excitation electrode 231 to the mounting terminal 224. Similarly to the base plate 120 illustrated in FIGS. 3A and 3B, the base plate 220 includes the level difference portions 127 on the surface at sides of the −Y'-axis side and the +X-axis side, and the −Y'-axis side and the −X-axis side. The level difference portion 127 includes the wiring electrode 225. The mounting terminal 224 and the wiring electrode 225 are formed of the first metal film 151, the second metal film 152, and the electroless plating film 153.

FIG. 11B is an enlarged view of the portion enclosed by a dotted line 162 of FIG. 11A. FIG. 11B illustrates an enlarged cross-sectional view of the mounting terminal 224. The first metal film 151 is formed of three layers: a first layer 151a, a second layer 151b, and a third layer 151c. As illustrated in FIG. 2B, the first layer 151a is made of a chrome (Cr), the second layer 151b is made of a nickel tungsten (Ni—W), a platinum (Pt), or similar material, and the third layer 151c is made of a gold (Au).

The second metal film 152 includes a first layer 152a, a second layer 152b, and a third layer 152c. The first layer 152a is formed on the surface of the first metal film 151. The second layer 152b is formed on the surface of the first layer 152a. The third layer 152c is formed on the surface of the second layer 152b. The first layer 152a, the second layer 152b, and the third layer 152c are formed of the same constitution as the first layer 151a, the second layer 151b, and the third layer 151c of the first metal film 151, respectively. In short, the second metal film 152 is formed of the same constitution as the first metal film 151.

The electroless plating film 153 is formed of the first layer 153a and the second layer 153b. The first layer 153a is formed on a surface of the second metal film 152. The second layer 153b is formed on a surface of the first layer 153a. The first layer 153a is a nickel (Ni) layer and has the thickness TN of 1 μm to 3 μm. To ensure connection of the mounting terminal 224 and a solder or similar material, the second layer 153b made of a gold (Au) is formed on a surface of the first layer 153a.

Fabrication Method of the Piezoelectric Device 200

Figure 12:
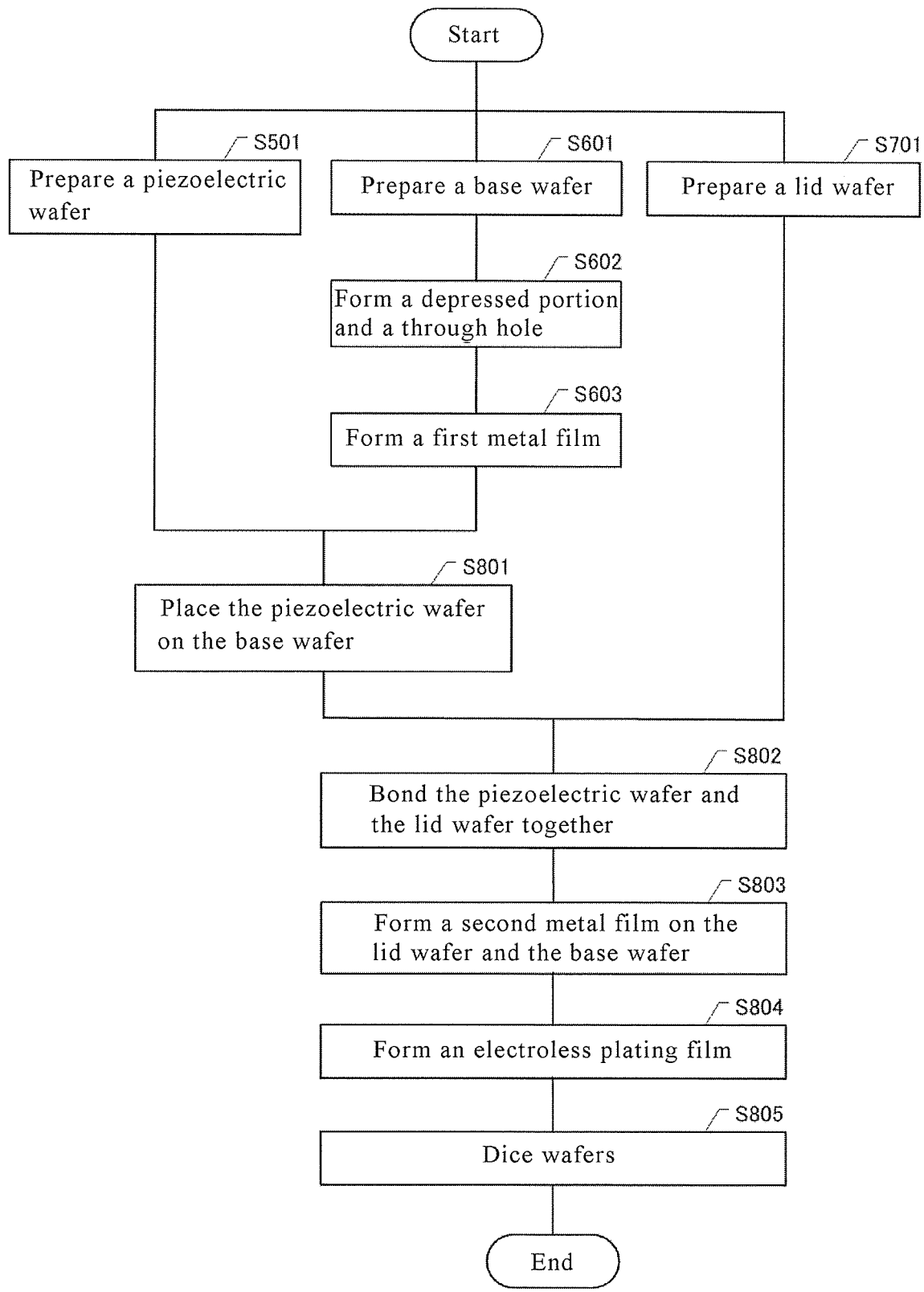
FIG. 12 is a flowchart illustrating a method for fabricating the piezoelectric device 200.

FIG. 12 is a flowchart illustrating a method for fabricating the piezoelectric device 200. A description will be given of the method for fabricating the piezoelectric device 200 following the flowchart of FIG. 12.

In step S501, a piezoelectric wafer W230 is prepared. A plurality of piezoelectric vibrating pieces 230 is formed on the piezoelectric wafer W230. Step S501 is a process for preparing a piezoelectric wafer.

Figure 13:
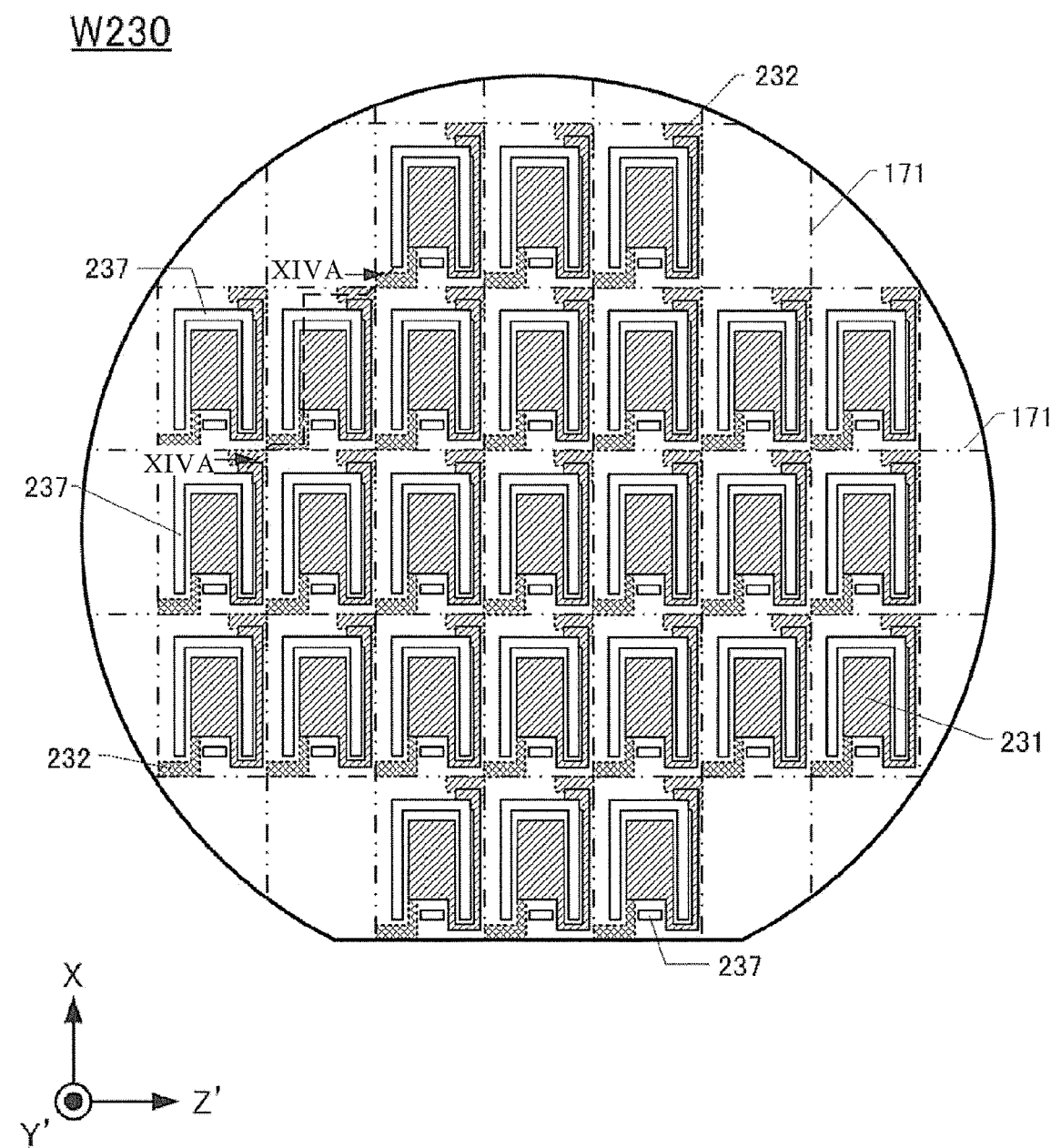
FIG. 13 is a plan view of a piezoelectric wafer W230.

FIG. 13 is a plan view of the piezoelectric wafer W230. A plurality of piezoelectric vibrating pieces 230 (as shown in FIG. 10) is formed on the piezoelectric wafer W230. In FIG. 13, a scribe line 171 is illustrated at a boundary between the piezoelectric vibrating pieces 230 adjacent one another. The through groove 237 is formed by etching in the piezoelectric wafer W230, and the excitation electrode 231 and the extraction electrode 232 are formed on the piezoelectric wafer W230. Thus, a plurality of piezoelectric vibrating pieces 230 is formed.

In step S601, a base wafer W220 is prepared. A plurality of base plates 220 is formed on the base wafer W220. Step S601 is a process for preparing a base wafer. The base wafer W220 prepared in step S601 has a planar shape, and a material such as a crystal or a glass is employed as the base material.

In step S602, the depressed portion 121, the through hole 172 (see FIG. 5B), and the depressed portion 173 (see FIG. 5B) are formed on the base wafer W220. The through hole 172 becomes the castellation 126 by dicing the base wafer W220. The depressed portion 173 becomes the level difference portion 127 by dicing the base wafer W220. Step S602 is a process for forming a depressed portion and a through hole.

In step S603, the first metal film 151 is formed on the base wafer W220. As illustrated in FIG. 11A, the first metal film 151 forms a part of the connecting electrode 223, the wiring electrode 225, and the mounting terminal 224. Step S603 is a process for forming a first metal film. In this step S603, the surface at the −Y'-axis side of the base wafer W220 is formed with a shape similar to a shape in FIG. 5B.

In step S701, the lid wafer W110 is prepared. A plurality of lid plates 110 is formed on the lid wafer W110. Step S701 is a process for preparing a lid wafer.

In step S801, the piezoelectric wafer W230 is placed on the base wafer W220. Step S801 is a placement process where the base wafer W220 and the piezoelectric wafer W230 are bonded together such that each piezoelectric vibrating piece 230 of the piezoelectric wafer W230 is placed corresponding to the surface at the +Y'-axis side of each base plate 220 of the base wafer W220. In this placement process, the bonding surface 122 of the base wafer W220 is bonded on the surface at the −Y'-axis side of the framing portion 235, which is formed on the piezoelectric wafer W230, via the sealing material 142.

In step S802, the piezoelectric wafer W230 and the lid wafer W110 are bonded together. Step S802 is a bonding process where the lid wafer W110 is bonded to the surface at the +Y'-axis side of the piezoelectric wafer W230 via the sealing material 142, so as to seal the vibrator 234 of the piezoelectric vibrating piece 230.

Figure 14:
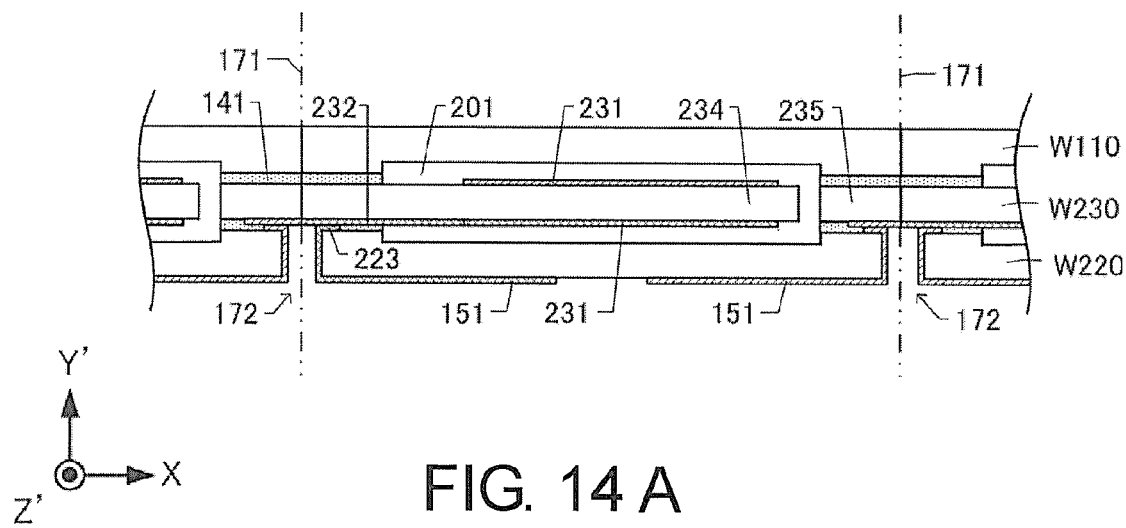
FIG. 14A is a partial cross-sectional view of the piezoelectric wafer W230, the lid wafer W110, and a base wafer W220.
FIG. 14B is a partial cross-sectional view of the piezoelectric wafer W230, the lid wafer W110, and the base wafer W220 where a second metal film 152 is formed.
FIG. 14C is a partial cross-sectional view of the piezoelectric wafer W230, the lid wafer W110, and the base wafer W220 where the electroless plating film 153 is formed.
Figure 14:
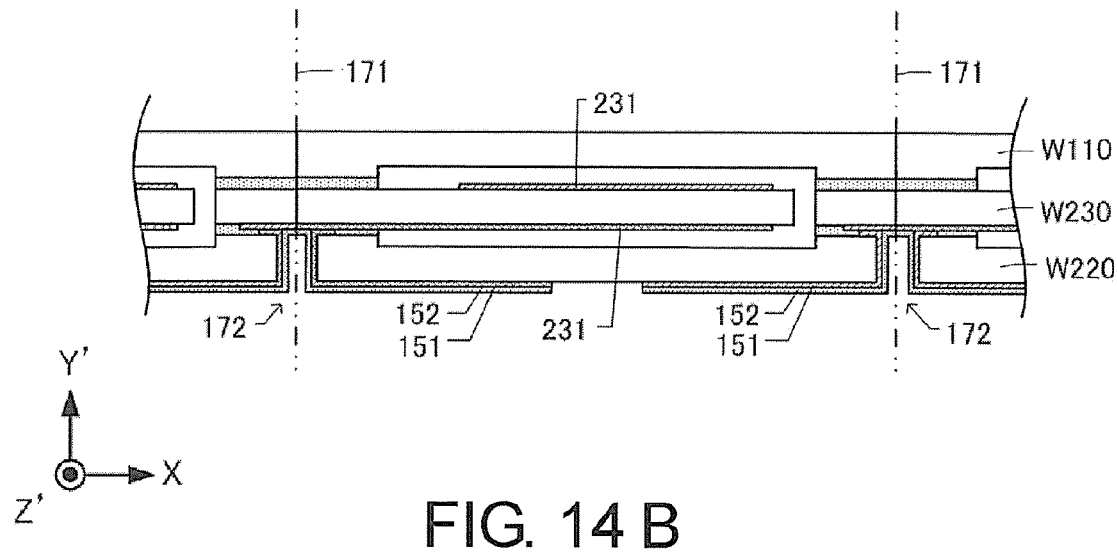
Figure 14:
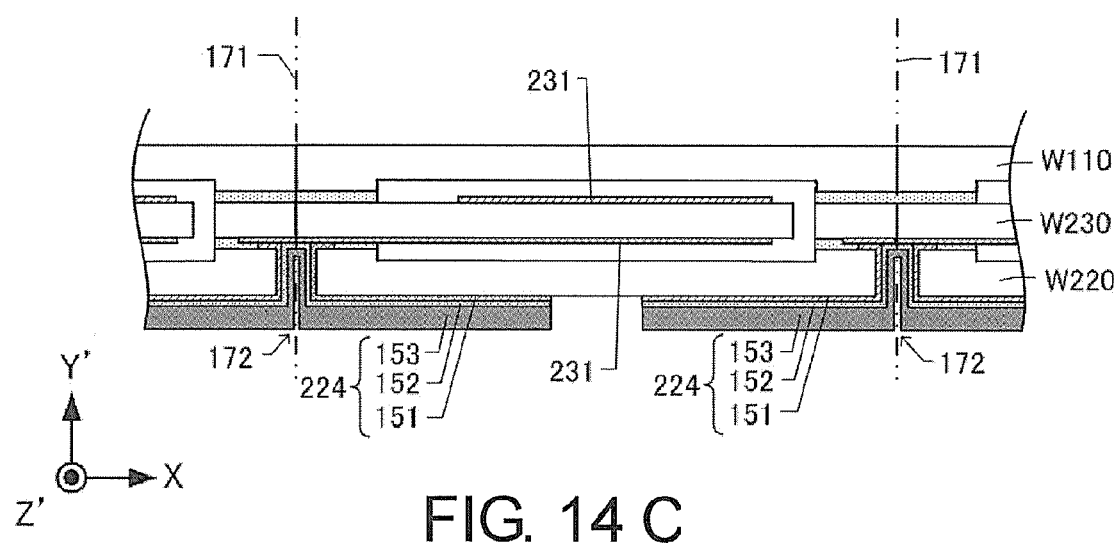

FIG. 14A is a partial cross-sectional view of the piezoelectric wafer W230, the lid wafer W110, and the base wafer W220. FIG. 14A is a cross-sectional view including a cross section taken along the line XIVA-XIVA of FIG. 13. The base wafer W220 is bonded to the surface at the −Y'-axis side of the framing portion 235 of the piezoelectric wafer W230 via the sealing material 142. The connecting electrode 223 electrically connects to the extraction electrode 232. The lid wafer W110 is bonded to the surface at the +Y'-axis side of the framing portion 235 of the piezoelectric wafer W230 via the sealing material 142. This forms a cavity 201 in the wafers, and the vibrator 234 is sealed into this cavity 201.

In step S803, the second metal film 152 is formed on the base wafer W220. Step S803 is a process for forming a second metal film.

FIG. 14B is a partial cross-sectional view of the base wafer W220 where the piezoelectric wafer W230, the lid wafer W110, and the second metal film 152 are formed. The second metal film 152, which is formed on the surface at the −Y'-axis side of the base wafer W220, is formed on the surface of the first metal film 151, which is formed on the surface at the −Y'-axis side of the base wafer W220.

In step S804, the electroless plating film 153 is formed on the base wafer W220. The electroless plating film 153 is formed on the surface of the second metal film 152 formed on the base wafer W220. Step S804 is a process of electroless plating.

FIG. 14C is a partial cross-sectional view of the piezoelectric wafer W230, the lid wafer W110, and the base wafer W220 where the electroless plating film 153 is formed. The electroless plating film 153, which is formed on the base wafer W220, is formed on the surface of the second metal film 152. A nickel layer, which forms the electroless plating film 153, is formed to have the thickness TN of 1 μm to 3 μm at a deposition rate of 5 μm/hour to 15 μm/hour as illustrated in FIG. 8.

In step S805, the base wafer W220, the lid wafer W110, and the piezoelectric wafer W230 are diced at the scribe line 171. Thus, individual piezoelectric devices 200 are formed.

With the piezoelectric device 200, the depressed portion 173 is formed similarly to the piezoelectric device 100. This suppresses distortion of the piezoelectric device 200, thus preventing detachment of the mounting terminal 224. The electroless plating film 153 may not be formed due to contamination of the surface of the metal film, which becomes a foundation layer, or similar cause. With the piezoelectric device 200, formation of the second metal film 152, which becomes a foundation layer, immediately before performing electroless plating suppresses influence by contamination of the foundation layer or similar cause at electroless plating to the minimum. This prevents the situation where the electroless plating film 153 is not formed by a cause such as contamination of the foundation layer.

Representative embodiments are described in detail above; however, as will be evident to those skilled in the relevant art, this disclosure may be changed or modified in various ways within its technical scope.

For example, an oscillator may be embedded to the piezoelectric device, so as to form a piezoelectric oscillator. Additionally, the above-described embodiments disclose a case where the piezoelectric vibrating piece is an AT-cut quartz-crystal vibrating piece. A BT-cut quartz-crystal vibrating piece or similar member that similarly vibrates in the thickness-shear mode is similarly applicable. Further, the piezoelectric vibrating piece is basically applicable to a piezoelectric material that includes not only a quartz-crystal material but also lithium tantalite, lithium niobate, and piezoelectric ceramic.

In the first aspect of the disclosure, the piezoelectric device according to a second aspect is configured as follows. In the mounting terminal, a second metal film is formed on a surface of the metal film, and the electroless plating film is formed on a surface of the second metal film.

In the first aspect and the second aspect of the disclosure, the piezoelectric device according to a third aspect is configured as follows. The connecting electrode is formed of only the metal film.

In the first aspect to the third aspect of the disclosure, the piezoelectric device according to a fourth aspect is further configured as follows. A piezoelectric vibrating piece includes the vibrator, a framing portion, and a connecting portion. The framing portion surrounds the vibrator. The connecting portion connects the vibrator and the framing portion together. The base plate and the lid plate are bonded together with the framing portion sandwiched between the base plate and the lid plate.

In the first aspect to the fourth aspect of the disclosure, the piezoelectric device according to a fifth aspect is configured as follows. The electroless plating film includes a nickel layer, and the nickel layer has a film thickness of 1 µm to 3 µm.

A method for fabricating the piezoelectric device according to a sixth aspect is a method for fabricating a surface mount type piezoelectric device. The method includes preparing a plurality of piezoelectric vibrating pieces, preparing a base wafer that includes a plurality of rectangular base plates, forming a depressed portion, forming a through hole, a first metal film forming, placing, preparing a lid wafer, bonding one principal surface, plating, and dicing. The depressed portion is depressed toward one principal surface side of the base wafer. The depressed portion is disposed at least at a part of a boundary of the base plates adjacent one another on the base wafer. The through hole is disposed at least at a part of the boundary. The through hole contacts the depressed portion. The through hole passes through from the one principal surface to another principal surface on the base wafer. The first metal film forming forms the first metal film by sputtering or vacuum evaporation on a region where a mounting terminal is to be formed, on the depressed portion, and on the through hole of the base wafer. The piezoelectric device is to be mounted with the mounting terminal. The placing places the plurality of piezoelectric vibrating pieces on the one principal surface of the base wafer. The lid wafer includes a plurality of lid plates. The bonding bonds one principal surface of the lid wafer on the another principal surface of the base wafer to seal the vibrator. The plating plates an electroless plating film on a surface of the metal film, after the one principal surface bonding. The dicing dices the base wafer and the lid wafer at the boundary, after the electroless plating.

A method for fabricating the piezoelectric device according to a seventh aspect is a method for fabricating a surface mount type piezoelectric device. The method includes preparing a piezoelectric wafer, preparing a base wafer, forming a depressed portion, forming a through hole, a first metal film forming, bonding the base wafer and the piezoelectric wafer, preparing a lid wafer, bonding one principal surface, plating, and dicing. The piezoelectric wafer includes a plurality of piezoelectric vibrating pieces. The piezoelectric vibrating piece includes a vibrator, a framing portion, and a connecting portion. The vibrator vibrates at a predetermined vibration frequency. The framing portion surrounds the vibrator. The connecting portion connects the vibrator and the framing portion. The base wafer includes a plurality of rectangular base plates. The depressed portion is depressed toward one principal surface side of the base wafer. The depressed portion is disposed at least at a part of a boundary of the base plates adjacent one another on the base wafer. The through hole is disposed at least at a part of the boundary. The through hole contacts the depressed portion. The through hole passes through from the one principal surface to another principal surface on the base wafer. The first metal film forming forms a first metal film by sputtering or vacuum evaporation on a region where a mounting terminal is to be formed, on the depressed portion, and on the through hole of the base wafer, the piezoelectric device is to be mounted with the mounting terminal. The bonding bonds the base wafer and the piezoelectric wafer such that each of the piezoelectric vibrating pieces is placed on one principal surface of each of the base plates. The lid wafer includes a plurality of lid plates. The bonding bonds one principal surface of the lid wafer on the piezoelectric wafer to seal the vibrator. The plating plates an electroless plating film on a surface of the metal film after the one principal surface bonding. The dicing dices the base wafer, the lid wafer, and the piezoelectric wafer at the boundary after the electroless plating.

In the sixth aspect and the seventh aspect of the disclosure, the method for fabricating the piezoelectric device according to an eighth aspect further includes a second metal film forming that forms a metal film on a surface of the metal film formed on the another principle surface of the base wafer after the one principal surface bonding and before the electroless plating.

In the sixth aspect to the eighth aspect of the disclosure, the method for fabricating the piezoelectric device according to a ninth aspect is configured as follows. The metal film includes a chromium layer, a nickel tungsten layer, and a gold layer. The nickel tungsten layer is formed on a surface of the chromium layer. The gold layer is formed on a surface of the nickel tungsten layer.

In the sixth aspect to the eighth aspect of the disclosure, the method for fabricating the piezoelectric device according to a tenth aspect is configured as follows. The metal film includes a chromium layer, a platinum layer, and a gold layer. The platinum layer is formed on a surface of the chromium layer. The gold layer is formed on a surface of the platinum layer.

In the sixth aspect to the tenth aspect of the disclosure, the method for fabricating the piezoelectric device according to an eleventh aspect is configured as follows. The electroless plating film includes a nickel layer. The nickel layer is formed at a deposition rate of 5 µm/hour to 15 µm/hour.

In the eleventh aspect of the disclosure, the method for fabricating the piezoelectric device according to a twelfth aspect is configured as follows. The nickel layer of the electroless plating film has a film thickness of 1 to 3 µm.

With the piezoelectric device and the method for fabricating the piezoelectric device according to the embodiments, detachment of an electrode formed by electroless plating can be avoided.

The principles, preferred embodiment and mode of operation of the present disclosure have been described in the foregoing specification. However, the disclosure which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present disclosure. Accordingly, it is expressly intended that all such variations, changes and equivalents which fall within the spirit and scope of the present disclosure as defined in the claims, be embraced thereby.

What is claimed is:

1. A surface mount type piezoelectric device, comprising:
a piezoelectric vibrating piece that includes a vibrator with a pair of excitation electrodes and an extraction electrode extracted from the pair of excitation electrodes, the vibrator vibrating at a predetermined vibration frequency;
a base plate in a rectangular shape that has one principal surface and another principal surface, a pair of connecting electrodes being on the one principal surface and electrically connecting to the extraction electrodes, a pair of mounting terminals being on the another principal surface, the piezoelectric device being to be mounted with the pair of mounting terminals; and
a lid plate that seals the vibrator, wherein
the another principal surface of the base plate includes a pair of sides that face one another, at least the pair of sides having a level difference portion and a castellation, the level difference portion being depressed toward the one principal surface side, the castellation passing through from the another principal surface to the one principal surface,
a wiring electrode is at a part of the level difference portion and the castellation, the wiring electrode being extracted from the mounting terminal to the one principal surface of the base plate, and
the wiring electrode and the mounting terminal include a metal film and an electroless plating film, the metal film being formed by sputtering or vacuum evaporation, the electroless plating film being formed on the metal film by electroless plating.

2. The piezoelectric device according to claim 1, wherein in the mounting terminal, a second metal film is formed on a surface of the metal film, and
the electroless plating film is formed on a surface of the second metal film.

3. The piezoelectric device according to claim 1, wherein the connecting electrode is formed of only the metal film.

4. The piezoelectric device according to claim 1, wherein the piezoelectric vibrating piece includes the vibrator, a framing portion, and a connecting portion, wherein
the framing portion surrounds the vibrator,
the connecting portion connects the vibrator and the framing portion together, and
the base plate and the lid plate are bonded together with the framing portion sandwiched between the base plate and the lid plate.

5. The piezoelectric device according to claim 1, wherein the electroless plating film includes a nickel layer, and
the nickel layer has a film thickness of 1 µm to 3 µm.

* * * * *